United States Patent
Huang et al.

(10) Patent No.: US 8,518,823 B2
(45) Date of Patent: Aug. 27, 2013

(54) THROUGH SILICON VIA AND METHOD OF FORMING THE SAME

(75) Inventors: Kuo-Hsiung Huang, Hsinchu County (TW); Chun-Mao Chiou, Chiayi County (TW); Hsin-Yu Chen, Nantou County (TW); Yu-Han Tsai, Kaohsiung (TW); Ching-Li Yang, Ping-Tung Hsien (TW); Home-Been Cheng, Keelung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/335,948

(22) Filed: Dec. 23, 2011

(65) Prior Publication Data

US 2013/0161796 A1 Jun. 27, 2013

(51) Int. Cl.
*H01L 23/522* (2006.01)
*H01L 21/768* (2006.01)

(52) U.S. Cl.
USPC .... 438/667; 257/621; 257/774; 257/E23.011; 257/E23.174; 257/E21.538; 257/E21.597; 438/672; 438/675

(58) Field of Classification Search
USPC ................ 257/621, 774, E23.011, E23.174, 257/E21.538, E21.597; 438/667, 672, 675
See application file for complete search history.

(56) References Cited

U.S. PATENT DOCUMENTS

| | | | |
|---|---|---|---|
| 3,150,299 A | 9/1964 | Noyce | |
| 3,256,465 A | 6/1966 | Weissenstem | |
| 3,323,198 A | 6/1967 | Shortes | |
| 3,343,256 A | 9/1967 | Smith | |
| 3,372,070 A | 3/1968 | Zuk | |
| 3,462,650 A | 8/1969 | Hennings | |
| 3,648,131 A | 3/1972 | Stuby | |
| 4,394,712 A | 7/1983 | Anthony | |
| 4,395,302 A | 7/1983 | Courduvelis | |
| 4,616,247 A | 10/1986 | Chang | |
| 4,773,972 A | 9/1988 | Mikkor | |
| 4,939,568 A | 7/1990 | Kato | |
| 5,214,000 A | 5/1993 | Chazan | |
| 5,229,647 A | 7/1993 | Gnadinger | |
| 5,286,926 A | 2/1994 | Kimura | |
| 5,372,969 A | 12/1994 | Moslehi | |
| 5,399,898 A | 3/1995 | Rostoker | |
| 5,463,246 A | 10/1995 | Matsunami | |
| 5,484,073 A | 1/1996 | Erickson | |
| 5,502,333 A | 3/1996 | Bertin | |
| 5,627,106 A | 5/1997 | Hsu | |

(Continued)

OTHER PUBLICATIONS

Paul S. Ho, "Reliability Challenges for 3D Interconnects: A material and design perspective", Mar. 17, 2011.

*Primary Examiner* — Peniel M Gumedzoe
(74) *Attorney, Agent, or Firm* — Winston Hsu; Scott Margo

(57) ABSTRACT

The present invention relates to a through silicon via (TSV). The TSV is disposed in a substrate including a via opening penetrating through a first surface and a second surface of the substrate. The TSV includes an insulation layer, a barrier layer, a buffer layer and a conductive electrode. The insulation layer is disposed on the surface of the via opening. The barrier layer is disposed on the surface of the insulation layer. The conductive electrode is disposed on the surface of the buffer layer and fills the via opening. The buffer layer further covers a surface of the conductive electrode at the side of the second surface. The present invention further discloses a method of forming the TSV.

5 Claims, 8 Drawing Sheets

(56) References Cited

U.S. PATENT DOCUMENTS

| | | | |
|---|---|---|---|
| 5,793,115 A | 8/1998 | Zavracky | |
| 5,977,640 A | 11/1999 | Bertin | |
| 6,018,196 A | 1/2000 | Noddin | |
| 6,143,616 A | 11/2000 | Geusic | |
| 6,274,937 B1 | 8/2001 | Ahn | |
| 6,309,956 B1 | 10/2001 | Chiang | |
| 6,391,777 B1 | 5/2002 | Chen | |
| 6,407,002 B1 | 6/2002 | Lin | |
| 6,440,640 B1 | 8/2002 | Yang | |
| 6,483,147 B1 | 11/2002 | Lin | |
| 6,525,419 B1 | 2/2003 | Deeter | |
| 6,548,891 B2 | 4/2003 | Mashino | |
| 6,551,857 B2 | 4/2003 | Leedy | |
| 6,627,985 B2 | 9/2003 | Huppenthal | |
| 6,633,083 B2 | 10/2003 | Woo | |
| 6,746,936 B1 | 6/2004 | Lee | |
| 6,778,275 B2 | 8/2004 | Bowes | |
| 6,800,930 B2 | 10/2004 | Jackson | |
| 6,812,193 B2 | 11/2004 | Brigham et al. | |
| 6,831,013 B2 | 12/2004 | Tsai | |
| 6,897,148 B2 | 5/2005 | Halahan | |
| 6,924,551 B2 | 8/2005 | Rumer | |
| 6,930,048 B1 | 8/2005 | Li | |
| 7,034,401 B2 | 4/2006 | Savastiouk | |
| 7,052,937 B2 | 5/2006 | Clevenger | |
| 7,075,133 B1 | 7/2006 | Padmanabhan | |
| 7,098,070 B2 | 8/2006 | Chen | |
| 7,111,149 B2 | 9/2006 | Eilert | |
| 7,166,913 B2 | 1/2007 | Chinthakindi | |
| 7,222,420 B2 | 5/2007 | Moriizumi | |
| 7,282,951 B2 | 10/2007 | Huppenthal | |
| 7,323,785 B2 | 1/2008 | Uchiyama | |
| 7,338,896 B2 | 3/2008 | Vanhaelemeersch | |
| 7,402,515 B2 | 7/2008 | Arana | |
| 7,432,592 B2 | 10/2008 | Shi | |
| 7,531,415 B2 | 5/2009 | Kwok | |
| 7,541,677 B2 | 6/2009 | Kawano | |
| 7,732,926 B2 | 6/2010 | Uchiyama | |
| 7,846,837 B2 | 12/2010 | Kuo | |
| 2001/0038972 A1 | 11/2001 | Lyons | |
| 2004/0080041 A1 | 4/2004 | Kimura | |
| 2004/0188817 A1 | 9/2004 | Hua | |
| 2004/0203224 A1* | 10/2004 | Halahan et al. | 438/637 |
| 2005/0112997 A1 | 5/2005 | Lin | |
| 2005/0136635 A1 | 6/2005 | Savastiouk | |
| 2005/0205991 A1 | 9/2005 | Chen | |
| 2006/0035146 A1 | 2/2006 | Hayashi | |
| 2006/0042834 A1 | 3/2006 | Lee | |
| 2007/0020863 A1* | 1/2007 | Ma et al. | 438/297 |
| 2007/0117348 A1 | 5/2007 | Ramanathan | |
| 2007/0126085 A1 | 6/2007 | Kawano | |
| 2007/0190692 A1 | 8/2007 | Erturk | |
| 2008/0073747 A1 | 3/2008 | Chao | |
| 2008/0108193 A1 | 5/2008 | You | |
| 2009/0127667 A1 | 5/2009 | Iwata | |
| 2009/0134498 A1 | 5/2009 | Ikeda | |
| 2009/0180257 A1 | 7/2009 | Park | |
| 2009/0224405 A1 | 9/2009 | Chiou | |
| 2009/0280643 A1* | 11/2009 | Andry et al. | 438/656 |
| 2010/0001379 A1 | 1/2010 | Lee | |
| 2010/0130002 A1* | 5/2010 | Dao et al. | 438/628 |
| 2010/0140749 A1 | 6/2010 | Kuo | |
| 2010/0140772 A1 | 6/2010 | Lin | |
| 2010/0178761 A1 | 7/2010 | Chen | |
| 2010/0244247 A1 | 9/2010 | Chang | |
| 2010/0323478 A1 | 12/2010 | Kuo | |

* cited by examiner

THROUGH SILICON VIA AND METHOD OF FORMING THE SAME

BACKGROUND OF THE INVENTION

1. Field of the Invention

The present invention relates to a through silicon via (TSV) and a method of forming the same, and more particularly, to a TSV having a buffer layer and a method of forming the same.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronical products, the IC devices are becoming smaller, more delicate and more diversified.

As well known in the art, an IC device is produced from dies that are fabricated by conventional semiconductor manufacturing processes. The process for manufacturing a die starts with a wafer: first, different regions are marked on the wafer; secondly, conventional semiconductor manufacture processes such as deposition, photolithography, etching or planarization are used to form the needed circuit trace(s); then, each region of the wafer is separated to form a die, and packaged to form a chip; finally, the chip is attached onto a board, a printed circuit board (PCB), for example, and the chip is electrically coupled to the pins on the PCB. Thus, each function on the chip can be performed.

In order to evaluate the functions and the efficiency of the chip and increase the capacitance density to accommodate more IC components in a limited space, many semiconductor package technologies built up each die and/or chip by stacking, for example, Flip-Chip technology, Multi-chip Package (MCP) technology, Package on Package (PoP) technology and Package in Package (PiP) technology. Besides these technologies, a "Through Silicon Via (TSV)" technique has been developed in recent years. TSV can improve the interconnections between chips in the package so as to increase the package efficiency. However, since TSV is usually made of copper, which coefficient of thermal expansion (CTE) and the tensile modulus are very different from those of the silicon substrate, a lot of problems arise.

SUMMARY OF THE INVENTION

The present invention therefore provides a TSV having a buffer layer that has a buffer environment between the conductive electrode and the substrate.

According to one embodiment, the present invention provides a TSV disposed in a substrate having a via opening penetrating through a first surface and a second surface of the substrate. The TSV includes an insulation layer, a barrier layer, a buffer layer and a conductive electrode. The insulation layer is disposed on the surface of the via opening. The barrier layer is disposed on the surface of the insulation layer. The buffer layer is disposed on the surface of the barrier layer. The conductive electrode is disposed on the surface of the buffer layer and completely fills the via opening. The buffer layer further covers a surface of the conductive electrode at the side of the second surface.

According to another embodiment, the present invention provides a method of forming a TSV. A substrate is provided. The substrate includes a first surface and a second surface opposite to the first surface. Then, an opening is formed on the first surface of the substrate. An insulation layer is formed on the surface of the opening and a barrier layer is formed on the surface of the insulation layer. A buffer layer is formed on the surface of the barrier layer, and a conductive electrode is formed on the barrier layer to completely fill the opening. Lastly, a planarization process is performed upon the second surface of the substrate by using the buffer layer as a stop layer.

According to another embodiment, the present invention provides another method of forming a TSV. First, a substrate is provided. The substrate has a first surface and a second surface opposite to the first surface. Then, a dielectric layer is formed on the first surface of the substrate and an opening is formed in the dielectric layer and the substrate. Next, an insulation layer is formed on the surface of the opening and a contact hole is formed in the insulation layer and the dielectric layer; Subsequently, a buffer layer is formed on the substrate, wherein the buffer layer completely fills the contact hole and covers the surface of the insulation layer in the hole, such that the buffer layer in the contact hole becomes a contact via. Next, a conductive electrode layer is formed on the surface of the buffer layer to completely fill with the opening. Lastly, a planarization process is performed upon the second surface of the substrate to expose the buffer layer.

In the present invention, since the TSV includes a barrier layer and a buffer layer, an outstanding buffer environment and a high conductivity can be provided to the conductive electrode.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
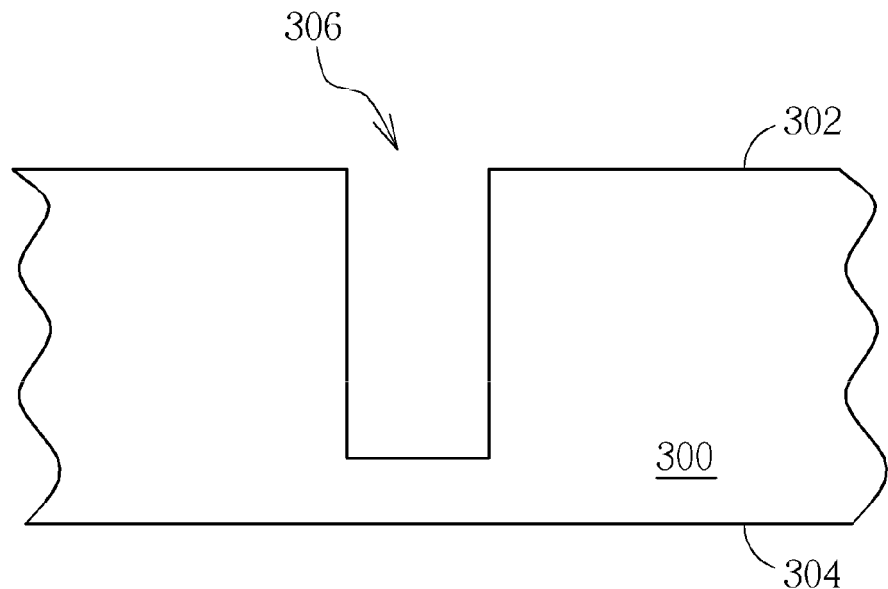
FIG. 1 to FIG. 9 are schematic diagrams that illustrate the method of forming the TSV according to one embodiment in the present invention.

Please refer to FIG. 1 to FIG. 9. FIG. 1 to FIG. 9 are illustrating schematic diagrams of the method of forming the TSV in the present invention. As shown in FIG. 1, a substrate 300 is provided. The substrate 300 may be a mono-crystalline silicon substrate, a gallium arsenide substrate or other kinds of substrates which are well known in the art. The substrate 300 includes a first surface 302 and a second surface 304 disposed at the opposite side of first surface 302. In one embodiment, the thickness of the substrate 300 is substantially between 700 and 1000 micro meters ($\mu m$). Then, an opening 306 is formed in the substrate 300 on the side of the first surface 302. The forming method, can include a dry etching step for example. In one embodiment, the aperture of the opening 306 is substantially between 5 and 10 $\mu m$, and the depth thereof is substantially between 50 and 100 $\mu m$. However, the forming method and the size of the opening 306 are not limited thereto and can be adjusted according to different designs of the products.

Figure 2:
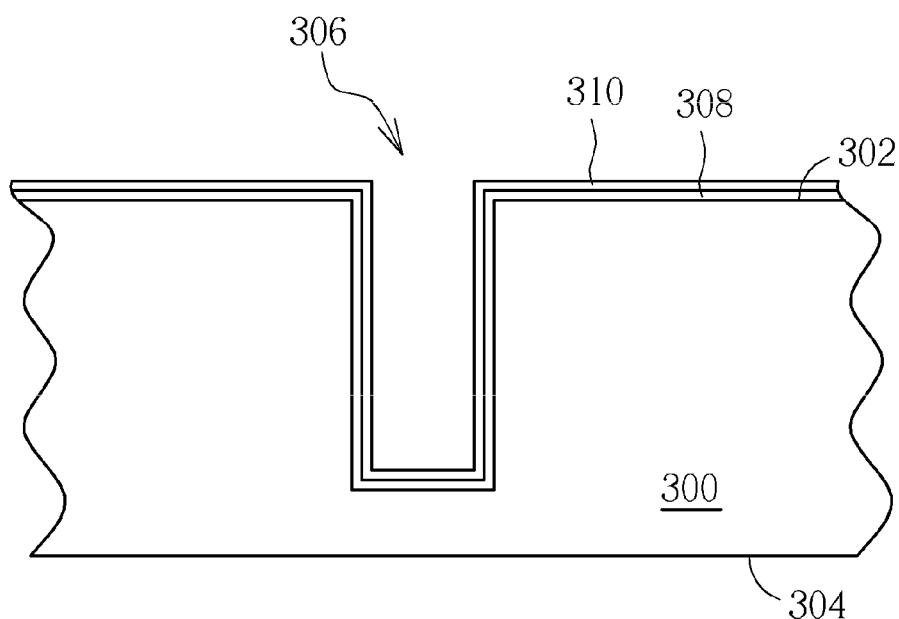

As shown in FIG. 2, an insulation layer 308 is formed on the first surface 302 of the substrate 300 to at least cover the surface of the opening 306. The insulation layer 308 can include various kinds of insulation materials, such as $SiO_2$. The thickness of the insulation layer 308 is substantially between 0.5 μm and 1.5 μm, preferably 1 μm. Subsequently, a barrier layer 310 is formed on the insulation layer 308 to at least cover the surface of the insulation layer 308 in the opening 306. The barrier layer 310 may includes Ti/TiN or Ta/TaN, but is not limited thereto. The thickness of the barrier layer 310 is substantially between 0.005 μm and 0.02 μm, preferably 0.01 to 0.02 μm.

Figure 3:
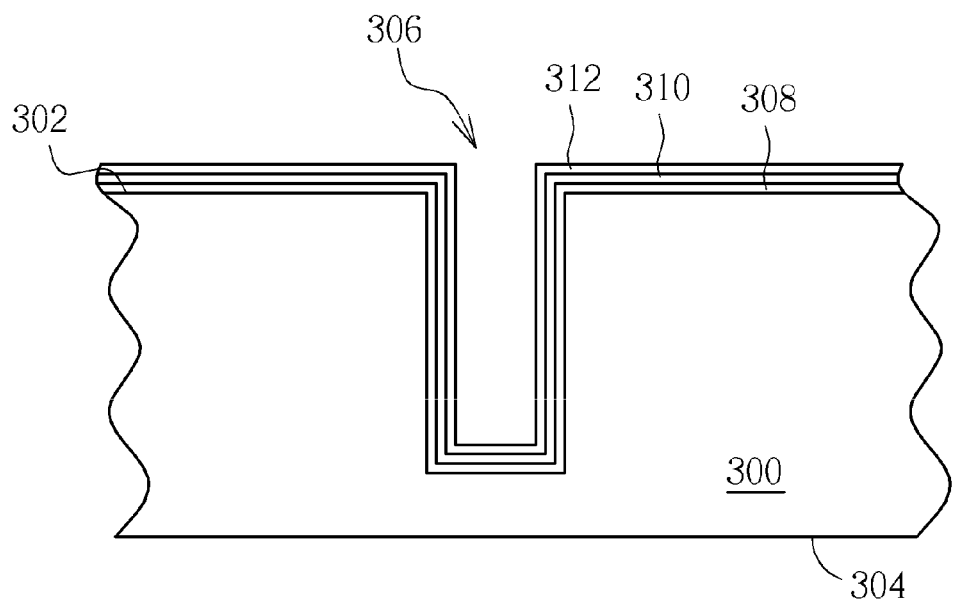

As shown in FIG. 3, a buffer layer 312 is formed on the barrier layer 310 to at least cover the surface of the barrier layer 310 in the opening 306. In one preferred embodiment, the buffer layer 312 includes tungsten (W) and the thickness thereof is substantially between 0.05 μm and 0.2 μm, preferably 0.1 μm.

Figure 4:
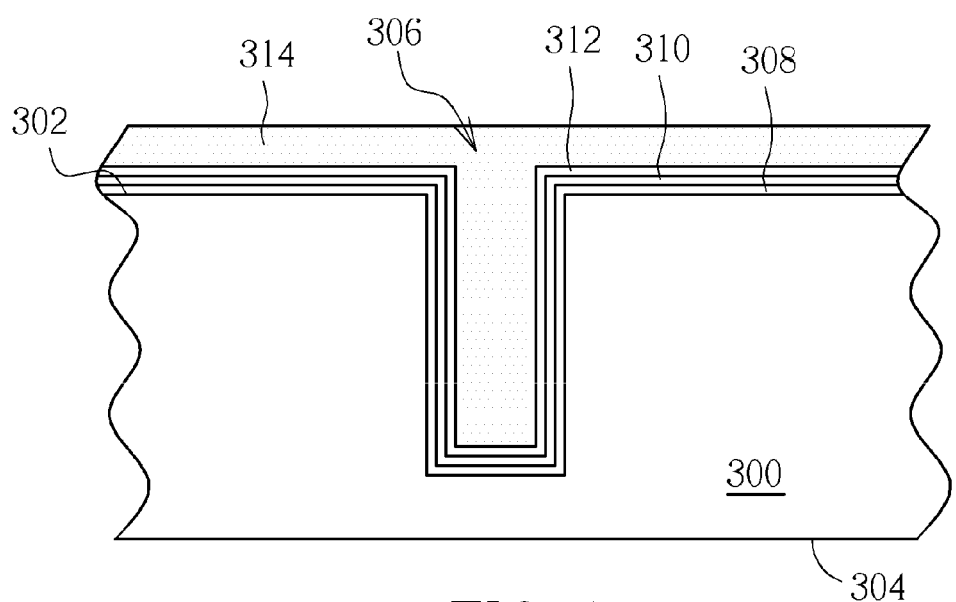

As shown in FIG. 4, a conductive electrode layer 314 is formed on the buffer layer 312 by an electroplating process for example. The buffer layer 312 is formed on the first surface 302 of the substrate 300 and completely fills the opening 306. In one preferred embodiment, the conductive electrode layer 314 includes copper (Cu) and the thickness filled in the opening 306 is substantially 10 μm.

Figure 5:
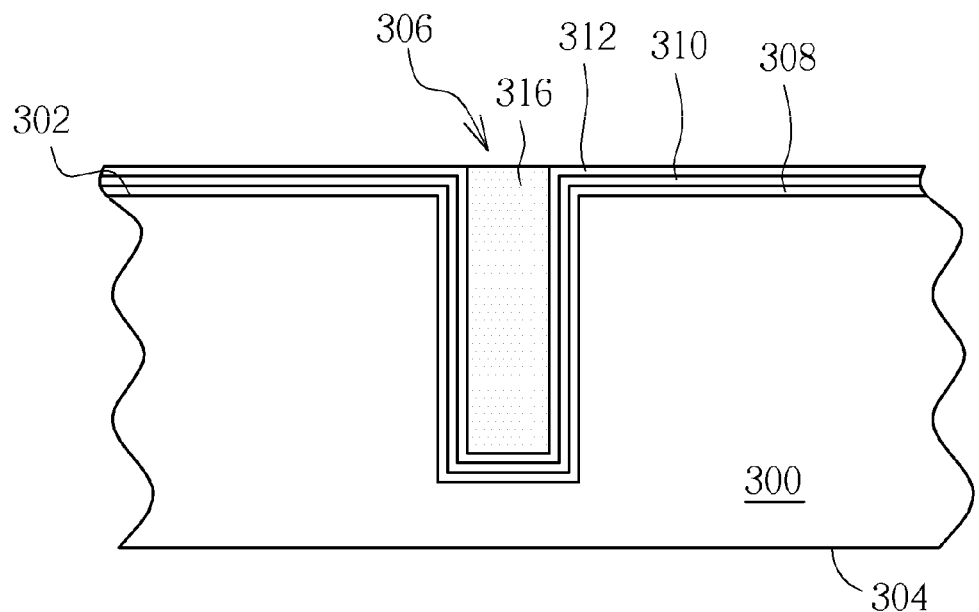

As shown in FIG. 5, a planarization process is performed upon the first surface 302 of the substrate 300. For instance, a chemical mechanical polish (CMP) process or an etching back process is performed to remove the conductive electrode layer 314 on the first surface 302 by using the buffer layer 312 as a stop layer to level the conductive electrode layer 314 with the buffer layer 312. The conductive electrode layer 314 in the opening 306 thus becomes a conductive electrode 316.

Figure 6:
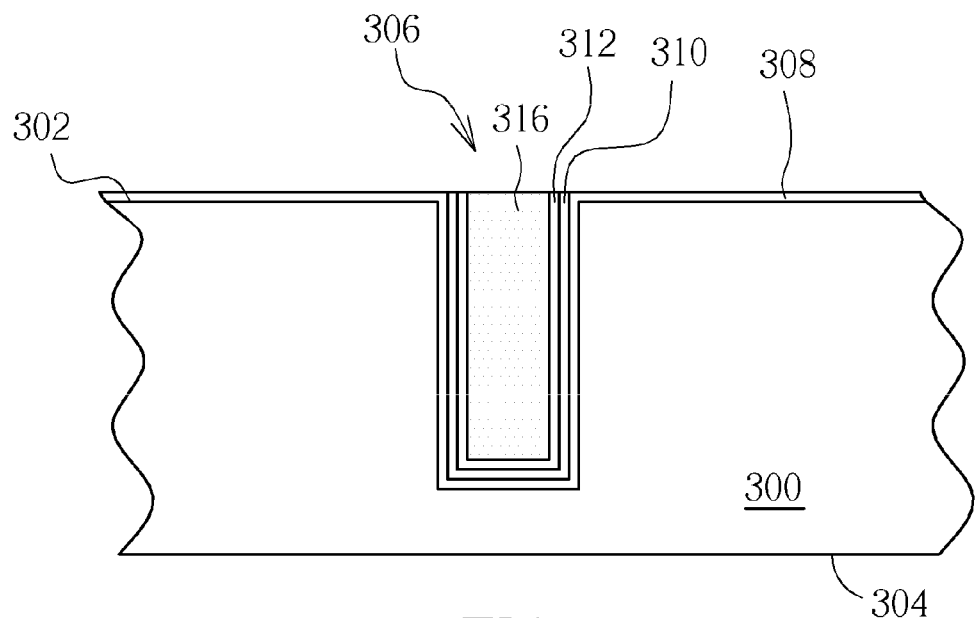

As shown in FIG. 6, another planarization process is performed upon the first surface 302 of the substrate 300 to remove the buffer layer 312 and the barrier layer 310 outside of the opening 306. The buffer layer 312 and the barrier layer 310 can be removed in one single planarization step or in two separated planarization steps. For example, a CMP process can be carried out to remove the buffer layer 312 and an etching step can be carried out to remove the barrier layer 310. In one embodiment, the insulation layer 308 can be kept, while in another embodiment, the insulation layer 308 can be removed.

Figure 7:
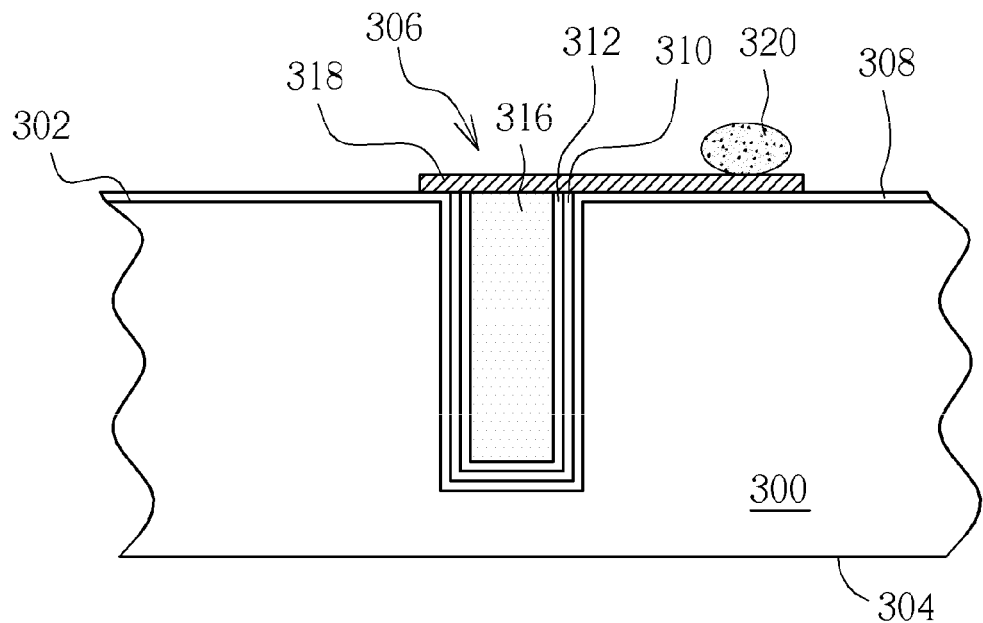

As shown in FIG. 7, a redistribution layer (RDL) 318 and a bumper 320 are formed on the first surface 302 of the substrate 300. The RDL 318 and the bumper 320 are electrically connected to the conductive electrode 316 to provide a pathway for signal input/output.

Figure 8:
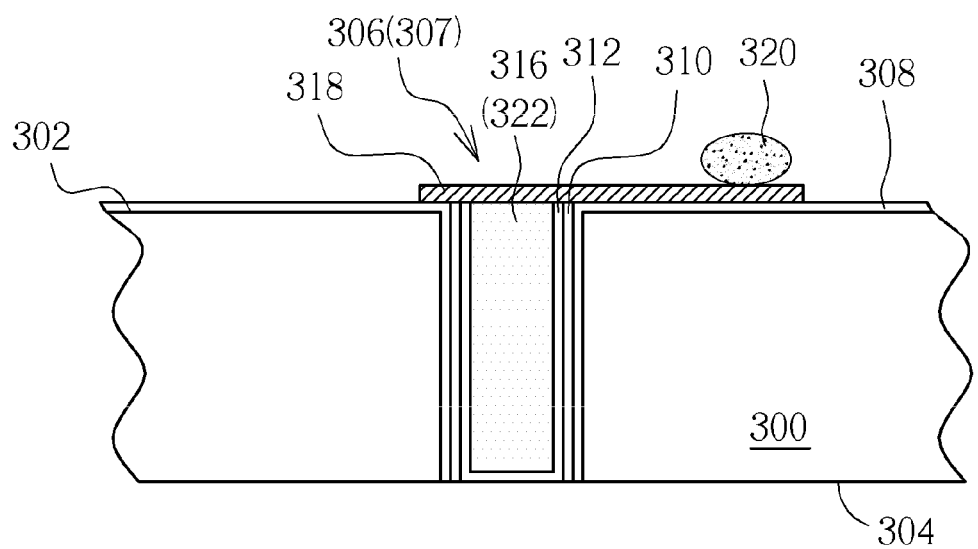
Figure 9:
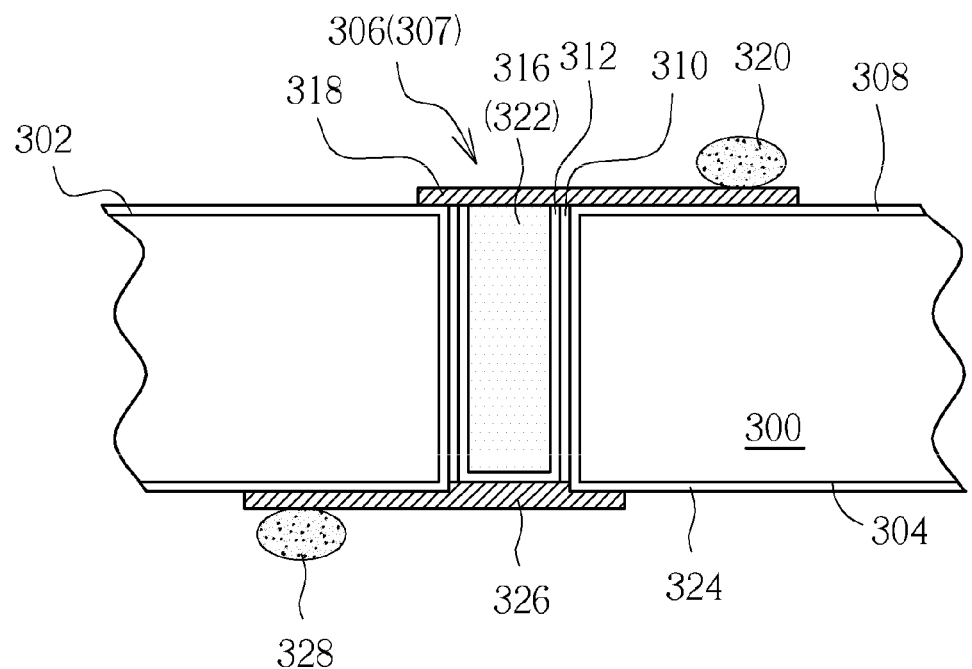

As shown in FIG. 8, a planarization process is performed upon the second surface 304 of the substrate 300. It is one salient feature of the present invention that the buffer layer 312 serves as a stop layer in the planarization process. That is, in the planarization process, a part of the substrate 300, a part of the insulation layer 308 and a part of the barrier layer 310 are removed, while the conductive electrode 316 is not removed and not exposed in this planarization process. In another embodiment, another insulation layer 324, another RDL 326 and another bumper 328 can be formed on the second surface 304 of the substrate 300 to electrically connect the buffer layer 312 to the second surface 304, as shown in FIG. 9.

It should be noted that, the above-mentioned description uses the front side via-last process as an example. That is, after the front-end-of-line (FEOL) and the back-end-of-line (BEOL) processes, the opening 306 is formed through an etching process or a laser process, and the insulation layer 308, the barrier layer 310, the buffer layer 312 and the conductive electrode 316 are then sequentially formed. Subsequently, a planarization process is carried out and the RDL 318 and the bumper 32o are formed to electrically connect to the conductive electrode 316. Besides, in another embodiment, the present invention can be formed through a via middle process, which is performed between the FEOL and the BEOL processes, so that the RDL 318 and the bumper 320 can be omitted. That is, after forming the TSV 322, the BEOL process is performed to form the metal interconnection system and the contact pads which are electrically connected to the TSV to provide pathways for signal input/output. In another embodiment, the present invention can also be formed through a backside via-last process.

Please refer to FIG. 8 again, the present invention provides a TSV 322 structure. The TSV 322 is disposed in a via opening 307 in the substrate 300 (In this step, the opening 306 becomes a via opening 307 that penetrates through the first surface 302 and the second surface 304). The TSV 322 includes an insulation layer 308, a barrier layer 310, a buffer layer 312 and a conductive electrode 316. The insulation layer 308 is disposed on the surface of the via opening 307. The barrier layer 310 is disposed on the surface of the insulation layer 308. The buffer layer 312 is disposed on the surface of the barrier layer 310. The conductive electrode 316 is disposed on the surface of the buffer layer 312 and completely fills the via opening 307. The buffer layer 312 further covers a surface of the conductive electrode 316 at the side of the second surface 304 and levels with the second surface 304 to make the conductive electrode 316 not exposed to the second surface 304.

In the present invention, since the buffer layer 312 composed of tungsten is disposed between the conductive electrode 316 and the substrate 300, a lot of advantages can be obtained. For example, the CTE of the silicon is about 2.3 ppm/K, the CTE of the tungsten is about 4.4 ppm/K, and the CTE of the copper is about 17 ppm/K. When placing the buffer layer 312 composed of tungsten between the conductive electrode 316 composed of copper and the substrate 300 composed of silicon, the buffer layer 312 can provide a buffer environment for the conductive electrode 316, and the problem of silicon cracks due to the great difference in CTE in conventional arts can be prevented. Besides, the Young's Modulus of silicon is about 130 GPa, the Young's Modulus of tungsten is about 400 GPa, and the Young's Modulus of copper is about 110 GPa. The buffer layer 312 composed of tungsten having a higher Young's Modulus can therefore provide physical protection to the conductive electrode 316. Furthermore, since the buffer layer 312 is disposed on a surface of the conductive electrode 316 at the side of the second surface 304, it can also prevent the contamination of the copper from the substrate 300. It is worth noting that the present embodiment shows that the conductive electrode 316 is made of copper while the buffer layer 312 is made of tungsten. However, to one of ordinary skills in the art, the buffer layer 312 can be of other materials that can be matched with the conductive electrode 316 and the substrate 300, and can be adjusted according to the materials of the conductive electrode 316 and the substrate 300.

In addition, the TSV 322 in the present invention also provides a barrier layer 310 to increase the adhesiveness between the insulation layer 308, the buffer layer 312 and the conductive electrode 316. Since the barrier layer 310 includes Ti/TiN which has a Young's Modulus of about 115 GPa, it is unable to provide the buffer function when being used alone without the buffer layer 312. In another aspect, when increasing the thickness of the buffer layer 312, the conductivity of the TSV 322 will be reduced. Thus, the present invention provides the TSV 322 structure containing both the buffer layer 312 and the barrier layer 310, which provides good buffer environment for the conductive electrode 316 and also improves the conductivity thereof. In one preferred embodiment of the present invention, a ratio of the thickness of the buffer layer 312 and the thickness of the conductive electrode 316 is substantially greater than 0.001, preferably between 0.01 and 1, and a ratio of the thickness of the barrier layer 310 and the thickness of the conductive electrode 316 is substantially between 0.001 and 0.01.

Figure 10:
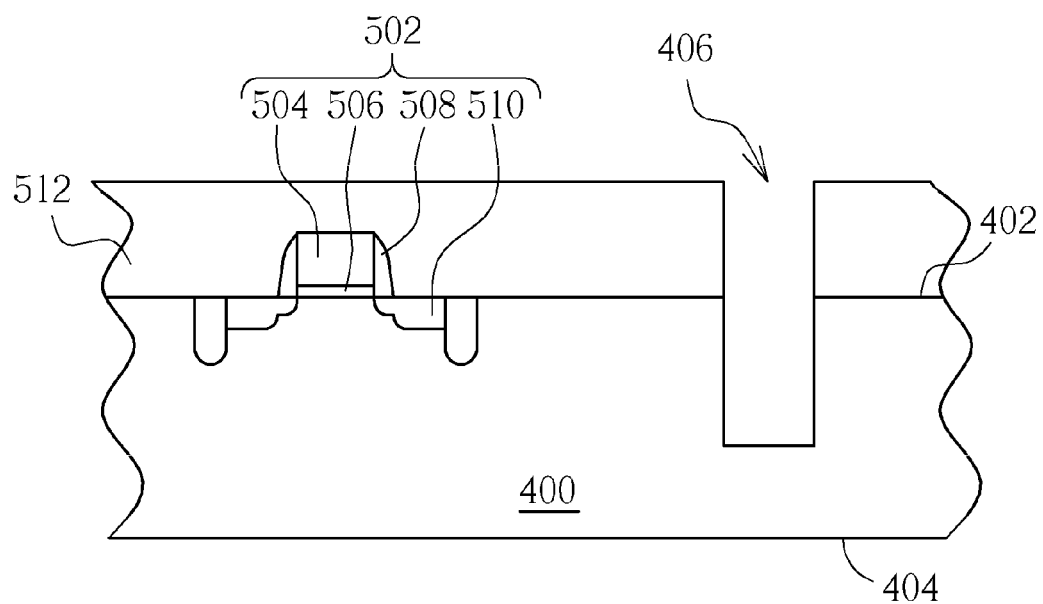
FIG. 10 to FIG. 15 are schematic diagrams that illustrate the method of forming the TSV according to another embodiment in the present invention.

In another embodiment, when the TSV is formed in a via middle process, it can be formed simultaneously with contact via. Please refer to FIG. 10 to FIG. 15, illustrating schematic diagrams of the method of forming the TSV according to another embodiment of the present invention. As shown in FIG. 10, a substrate 400 is provided. The substrate 400 may be a mono-crystalline silicon substrate, a gallium arsenide substrate or other kinds of substrates which are well known in the art. The substrate 400 includes a first surface 402 and a second surface 404 disposed at the opposite side of first surface 402. In one embodiment, the thickness of the substrate 400 is substantially between 700 and 1000 micro meters. Subsequently, a semiconductor device is formed on the first surface 402 of the substrate 400, such as a metal oxide semiconductor (MOS) device 502, which includes a gate 504, a gate oxide 506, a spacer 508 and a source/drain region 510, for example. These elements of the MOS device 502 are well-known in the art and are omitted in description. However, the MOS device 502 may include other semiconductor elements such as salicide or epitaxial layer, but is not limited thereto. In another embodiment, the semiconductor device can still be other types of devices, such as planar transistor, non-planar transistor, capacitor, thin-film-transistor (TFT) or even photosensor, optical transmission device or micro-electrical mechanical system (MEMS), and are not limited thereto. Next, a dielectric layer 512 is formed on the substrate 400 and covers the MOS device 502. The dielectric layer 512 may include $SiO_2$ or other suitable dielectric materials. Then, an opening 406 is formed in the dielectric layer 512 and the substrate 400. The opening 406 penetrates through the dielectric layer 512 and further reaches to the substrate 400. In one embodiment, the aperture of the opening 406 is substantially between 5 and 10 μm, and the depth thereof is substantially between 50 and 100 μm. The forming method, for example, can include a dry etching step. However, the forming method and the size of the opening 406 are not limited thereto and can be adjusted according to different designs of the products.

Figure 11:
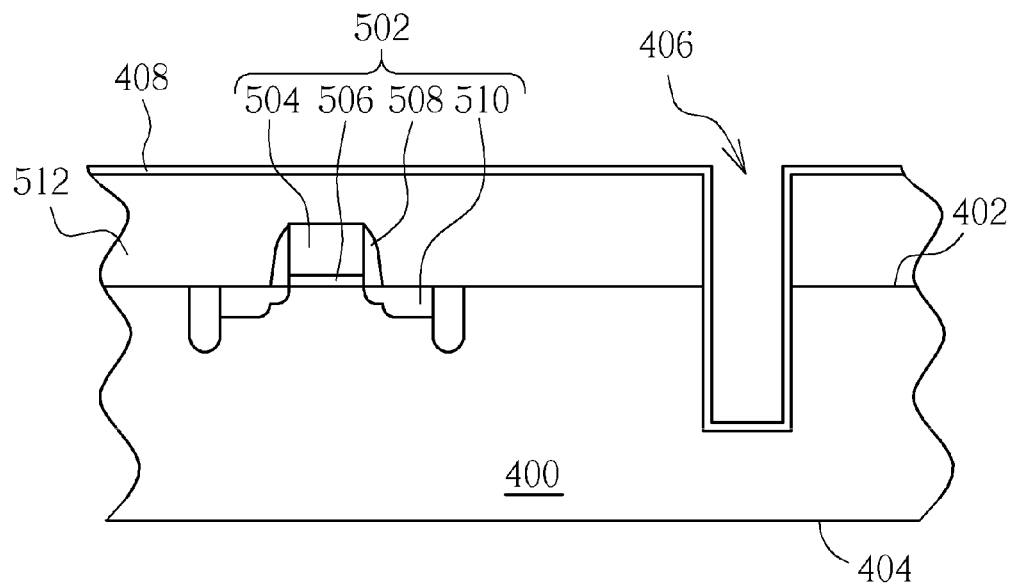

As shown in FIG. 11, an insulation layer 408 is formed on the substrate 400. The insulation layer 408 is formed on the surface of the dielectric layer 512 and conformally formed on the surface of the opening 406 but does not completely fill the opening 406. The insulation layer 408 can include various kinds of insulation materials, such as $SiO_2$. The thickness of the insulation layer 408 is substantially between 0.5 μm and 1.5 μm, preferably 1 μm.

Figure 12:
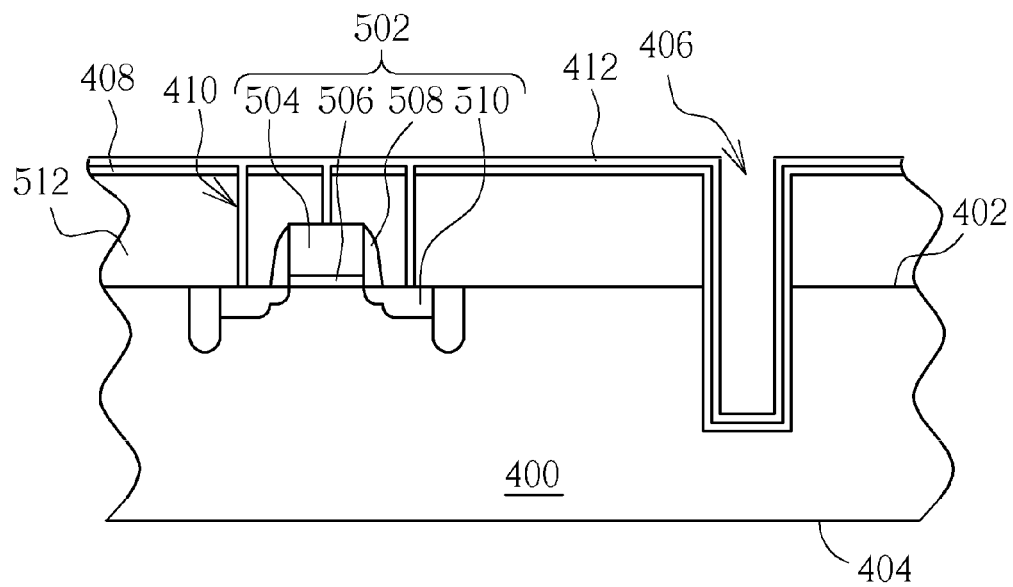

As shown in FIG. 12, at least a contact hole 410 is formed in the insulation layer 408 and the dielectric layer 512, exposing a part of the MOS device 502, such as the gate 504 and the source/drain region 510. Next, a buffer layer 412 is formed on the substrate 400. The buffer layer 412 is formed along the surface of the insulation layer 412 and is completely filling the contact hole 410. In detail, the buffer layer 412 is formed conformally on the surface of the insulation layer 408 in the opening 406, but does not completely fill the opening 406. In one preferred embodiment, the buffer layer 412 includes tungsten (W) and the thickness thereof is substantially between 0.05 μm and 0.2 μm, preferably 0.1 μm. Since the buffer layer 412 in the present invention is made of tungsten, in the subsequent steps, the buffer layer 412 in the contact hole 410 will become a contact via 411, while the buffer layer 412 in the opening 406 serves as a buffer material between the conductive electrode (Cu electrode for example) and the insulation layer 408 in the TSV.

Figure 13:
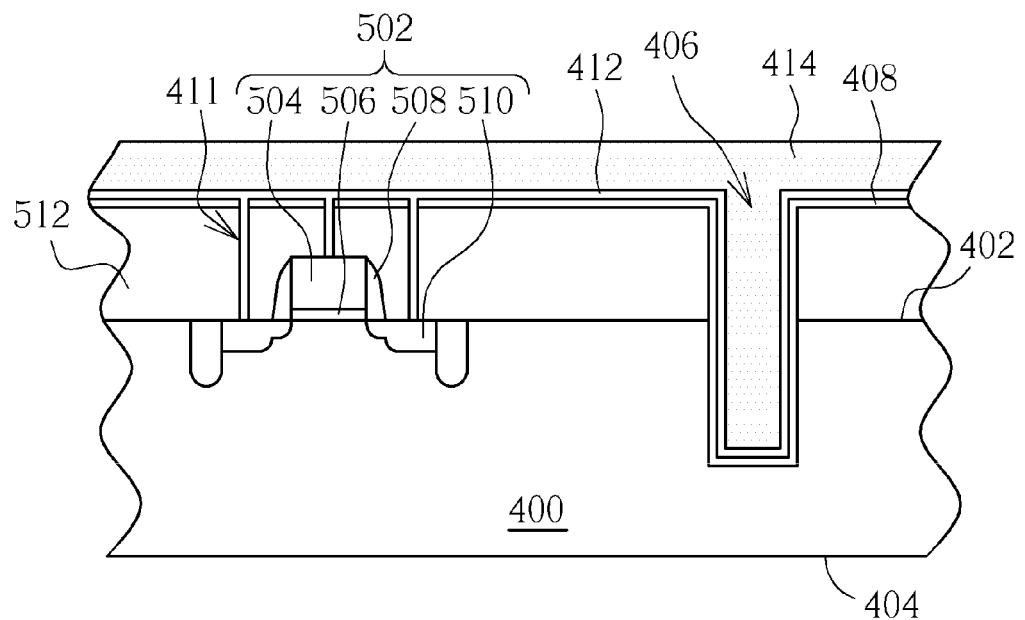

As shown in FIG. 13, a conductive electrode layer 414 is formed on the buffer layer 412 by an electroplating process for example. The buffer layer 412 is formed on the first surface 402 of the substrate 400 and completely fills the opening 406. In one preferred embodiment, the conductive electrode layer 414 includes copper (Cu) and the thickness filled in the opening 306 is substantially 10 μm.

Figure 14:
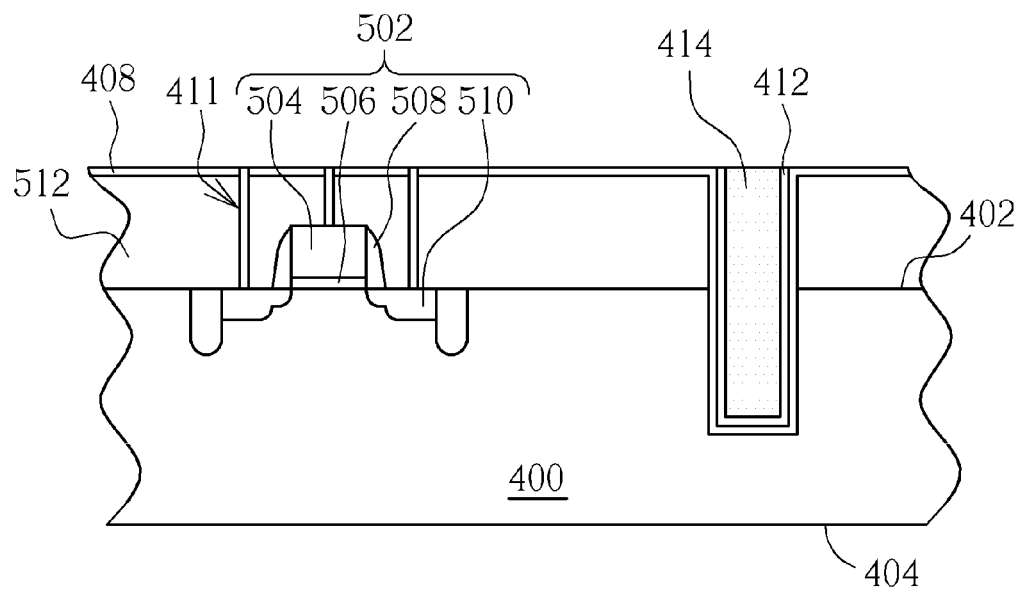
Figure 15:
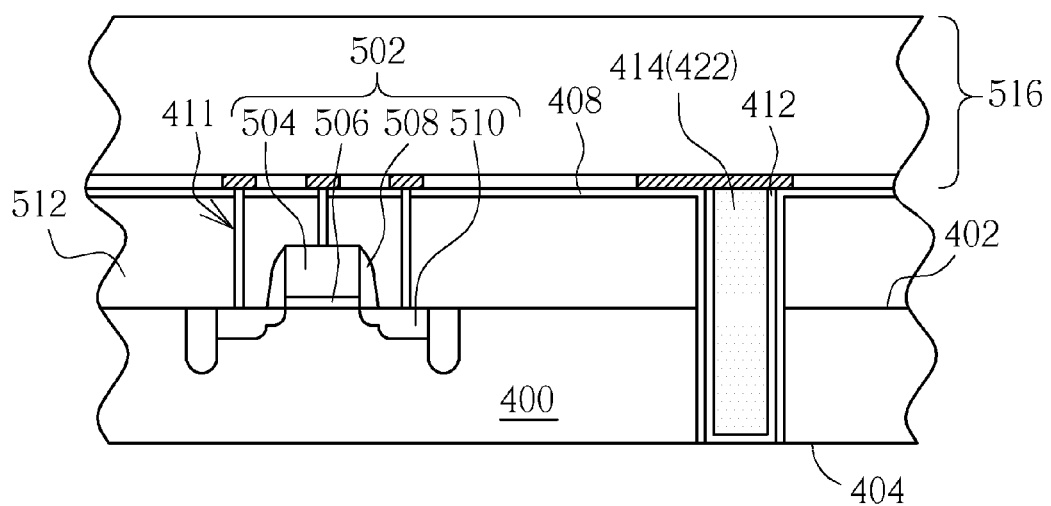

As shown in FIG. 14, a planarization process is performed upon the first surface 402 of the substrate 400 to remove the conductive electrode layer 414 and the buffer layer 412 on the insulation layer 408, which serves as a stop layer in the planarization process. The conductive electrode layer 414 and the buffer layer 412 can be removed in one single planarization step or in two separated planarization steps. For example, a CMP process can be carried out to remove the conductive electrode layer 414 and an etching step can be carried out to remove the buffer layer 412. In one embodiment, the insulation layer 408 can be kept, while in another embodiment, the insulation layer 408 and a part of the buffer layer 412 and conductive electrode layer 414 therein can be removed, As shown in FIG. 15, a metal interconnect system 516 is formed on the dielectric layer 512 on the substrate 400 to electrically connect the contact via 411. The metal interconnect system 516, for instance, may include a plurality of metal layers and a plurality of dielectric layers (not shown). Finally, another planarization process is carried out upon the second surface 404 of the substrate 400. In one embodiment, the buffer layer 412 serves as the stop layer during the planarization process, meaning that the buffer layer 412 will be exposed after the planarization process. In another embodiment, the conductive electrode layer 414 serves as the stop layer during the planarization process, meaning that the conductive electrode layer 414 will be exposed after the planarization process. In addition, in another embodiment, the planarization process can be carried out before forming the metal interconnect system 516. After the steps shown above, the TSV 422 in the present embodiment can be completed.

In conventional arts, it is known that the contact via and the TSV are formed separately. Additional planarization stop layer and additional barrier layer such as Ti/TiN layer are required in conventional TSV forming methods. Therefore, in the present embodiment, it is one salient feature that the buffer layer 412 including tungsten is utilized to simultaneously form the contact via 411 and the buffer material in the TSV. Consequently, the forming method can be streamlined comparing to conventional arts. Moreover, since the buffer layer 412 can provide the barrier function between the conductive electrode layer 414 and the insulation layer 408, no additional barrier layer is required in the present embodiment. On the other hand, the planarization process upon the first surface 402 of the substrate 400 utilizes the insulation layer 408 as the stop layer, which is able to provide a good planarization stop function. It is recognized that the method of simultaneously forming the TSV and the contact via can provide a relatively simple steps and can improve the yields.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a through silicon via (TSV), comprising:
   providing a substrate having a first surface and a second surface opposite to the first surface;
   forming a dielectric layer on the first surface of the substrate;
   forming an opening in the dielectric layer and the substrate;
   forming an insulation layer on a surface of the opening;
   forming a contact hole in the insulation layer and the dielectric layer;
   forming a buffer layer on the substrate, wherein the buffer layer completely fills the contact hole and covers a surface of the insulation layer in the hole, such that the buffer layer in the contact hole becomes a contact via;
   forming a conductive electrode layer on a surface of the buffer layer to completely fill a remainder of the opening; and
   performing a planarization process upon the second surface of the substrate to expose the buffer layer.

2. The method of forming a TSV according to claim 1, after forming the conductive electrode layer, further comprising performing a first planarization upon the first surface of the substrate.

3. The method of forming a TSV according to claim 2, wherein the insulation layer serves as a stop layer during the first planarization.

4. The method of forming a TSV according to claim 1, wherein the buffer layer comprises tungsten.

5. The method of forming a TSV according to claim 1, further comprising forming a semiconductor device on the substrate wherein the contact via electrically connects a part of the semiconductor device.

* * * * *